(12) United States Patent
Kroeninger et al.

(10) Patent No.: US 7,863,104 B2
(45) Date of Patent: Jan. 4, 2011

(54) METHOD OF PRODUCING A THIN SEMICONDUCTOR CHIP

(75) Inventors: Werner Kroeninger, Regensburg (DE); Manfred Kotek, Villach (AT); Adolf Koller, Regensburg (DE); Abdul Rahman Mohamed, Johor (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/246,983

(22) Filed: Oct. 7, 2008

(65) Prior Publication Data

US 2009/0098684 A1 Apr. 16, 2009

Related U.S. Application Data

(63) Continuation of application No. PCT/IB2006/000966, filed on Apr. 21, 2006.

(51) Int. Cl.
*H01L 21/00* (2006.01)

(52) U.S. Cl. .................. 438/114; 438/113; 438/462

(58) Field of Classification Search .............. 438/106, 438/113, 118, 460, 464, 114, 462; 257/619.783, 257/E21.499
See application file for complete search history.

(56) References Cited

U.S. PATENT DOCUMENTS

| | | | |
|---|---|---|---|
| 5,705,016 A * | 1/1998 | Senoo et al. ................ | 156/289 |
| 6,297,131 B1 | 10/2001 | Yamada et al. | |
| 6,974,721 B2 | 12/2005 | Koizumi et al. | |
| 7,405,137 B2 * | 7/2008 | Terayama et al. ............ | 438/462 |
| 7,569,421 B2 * | 8/2009 | Do et al. ..................... | 438/113 |
| 2002/0025432 A1 | 2/2002 | Noguchi et al. | |
| 2003/0139019 A1 * | 7/2003 | Kudo et al. .................. | 438/460 |
| 2004/0097084 A1 * | 5/2004 | Fukuda et al. ............... | 438/690 |
| 2005/0070072 A1 * | 3/2005 | Priewasser .................. | 438/460 |
| 2005/0176169 A1 | 8/2005 | Koizumi et al. | |
| 2005/0208736 A1 * | 9/2005 | Matsumura et al. ......... | 438/460 |
| 2005/0224978 A1 * | 10/2005 | Kawate et al. ............... | 257/753 |
| 2005/0236693 A1 | 10/2005 | Kroninger et al. | |
| 2006/0223234 A1 * | 10/2006 | Terayama et al. ............ | 438/113 |

(Continued)

FOREIGN PATENT DOCUMENTS

DE 10301245 A1 7/2004

(Continued)

OTHER PUBLICATIONS

English machine translation of DE10301245.*

*Primary Examiner*—Laura M Menz
(74) *Attorney, Agent, or Firm*—Edell, Shapiro & Finnan, LLC (57) ABSTRACT

A method of fabricating a semiconductor chip includes the providing an adhesive layer on the outer area of the active surface of a device wafer and attaching a rigid body to the active surface by the adhesive layer. The device wafer is thinned by treating the passive surface of the device wafer. A first backing tape is connected to the passive surface of the device wafer. The outer portion of the rigid body is separated from the central portion of the rigid body and the outer portion of the device wafer is separated from the central portion of the device wafer. The central portion of the rigid body, the outer portion of the device wafer and the outer portion of the rigid body are removed from the first backing tape. The device wafer may be diced into semiconductor chips.

22 Claims, 5 Drawing Sheets

U.S. PATENT DOCUMENTS

2008/0272476 A1*  11/2008  Do et al. .................... 257/686
2008/0315434 A1*  12/2008  McElrea et al. ............. 257/777
2009/0098684 A1*   4/2009  Kroeninger et al. ......... 438/114

FOREIGN PATENT DOCUMENTS

| JP | 11204551 | 7/1999 |
| JP | 20033332267 | 11/2003 |
| WO | 2005101459 A2 | 10/2005 |

* cited by examiner

METHOD OF PRODUCING A THIN SEMICONDUCTOR CHIP

CROSS REFERENCE TO RELATED APPLICATIONS

This application is a continuation of International Application No. PCT/IB2006/000966, filed on Apr. 21, 2006, entitled "A Method for Producing a Thin Semiconductor Chip," the entire contents of which are hereby incorporated by reference.

BACKGROUND

The trend towards miniaturization and system-in-packages is driving the demand for thin semiconductor chips. The thickness of semiconductor chips can be as low as 60 micrometers (μm) for a wafer of 8 inches diameter. When producing and handling a thin semiconductor chip, care must be exercised to prevent the chips from cracking. Therefore, a need arises for improved methods and procedures to separate and transport a thin chip for high volume applications.

Known methods suggest improving the semiconductor chip yield by improving the wafer dicing method. However, these methods often deliver unsatisfactory outcomes.

SUMMARY

A method of fabricating a semiconductor chip and in particular, a thin semiconductor chip is described herein. The method includes providing an adhesive layer on the outer area of the active surface of a device wafer and attaching a rigid body to the active surface by the adhesive layer. Next, the device wafer may be thinned by treating the passive surface of the device wafer that is opposite to the active surface. Thereafter, a first backing tape may be connected to the passive surface of the device wafer. Next, the outer portion of the rigid body may be separated from the central portion of the rigid body and the outer portion of the device wafer may be separated from the central portion of the device wafer. Subsequently, the central portion of the rigid body, the outer portion of the device wafer and the outer portion of the rigid body may be removed from the first backing tape. Thereafter, the device wafer may be diced into semiconductor chips.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to accompanying drawings, where.

DETAILED DESCRIPTION

Described herein is a method to produce a semiconductor chip and in particular, a thin semiconductor chip, that is capable of producing a high yield without sacrificing throughput.

According to one aspect of the described method, the yield of semiconductor chips can be improved by removing the rigid support body for the device wafer before wafer dicing. The rigid support body prevents cracks forming on the device wafer during thinning of the device wafer. However, debris produced from the rigid support body during wafer dicing often damages the device wafer.

An embodiment of the method of producing a semiconductor chip includes providing a wafer adhesive layer on the outer area of the active surface of a device wafer containing semiconductor chips. The wafer adhesive layer comprises a non-conductive material. This material prevents excessive wafer adhesive from forming short circuits between electrical circuits that are provided in the semiconductor chip.

The method further comprises attaching (e.g., bonding) a rigid body to the active surface of the device wafer by the adhesive layer. The rigid body may comprise a semiconductor material.

The passive surface of the device wafer may be mechanically ground to thin the device wafer. The rigid body (e.g., carrier wafer) supports the device wafer during wafer thinning to prevent formation of cracks on the device wafer. The need for small semiconductor packages is one driving factor for a thin device wafer.

A first backing tape can be attached to the passive surface of the device wafer and a mounting frame encircling the device wafer may be placed over the first backing tape.

The outer portion of the rigid body can be separated from the central portion of the rigid body. The separation may be achieved via a wafer saw. The wafer saw, for example, also cuts the device wafer and separates the outer portion of the device wafer from its central portion. Semiconductor chips are concentrated in the central portion of the device wafer.

The central portion of the rigid body can be removed from the first backing tape.

The outer portions of the device wafer and of the rigid body may be removed from the first backing tape.

The central portion of the device wafer can be diced into semiconductor chips. The first backing tape holds the wafer securely during wafer dicing and the dicing of the wafer may cut only the device wafer.

In known methods, the wafer saw cuts both the device wafer and the outer portion of the rigid body. A thicker wafer saw is needed to cut both the device wafer and the outer portion. The thicker wafer saw reduces the tolerance between the wafer saw-street and the width of cut made by the wafer saw. A wafer saw-street is the space between semiconductor chips that is earmarked for wafer sawing. A wider saw-street may be required to accommodate the thicker wafer saw. A wider saw-street reduces the space allocated by the device wafer for semiconductor chips. Moreover, wafer dicing of the rigid body generates debris, which often causes damage to the device wafer.

The described method allows for the removal of the outer portions of the rigid body and of the device wafer from the first backing tape.

An embodiment of the described method further comprises weakening the bonding at the outer portion of the first backing tape. The bonding agent is weakened by irradiating the tape with ultraviolet light. After this, the outer portions of the rigid body and of the device wafer are removed from the first backing tape. The first backing tape comprises an adhesive of a type that weakens in bonding property when irradiated with ultraviolet light.

According to an embodiment of the described method, the method further comprises weakening the bonding at the outer portion of the first backing tape by heat. This aspect of the described method is similar to the earlier aspect. The adhesive of the first backing tape is of kind that weakens in its bonding property when heated.

According to an embodiment of the described method, the method further comprises omitting the adhesive at the outer portion of the first backing tape. This omission is done prior to the step of applying the first backing tape over the passive surface of the device wafer. A layer of adhesive may be placed on the central portion of the first backing tape. The absence of adhesive at the outer portion eases the removal of the outer portions of the wafer device wafer and of the rigid body from the first backing tape.

According to an embodiment of the described method, the method further comprises bonding a second backing tape below the first backing tape. The second backing tape is bonded before the step of attaching a first backing tape to the passive surface of the device wafer. The adhesive of the first backing tape may be different from the adhesive of the second backing tape.

According to an embodiment of the described method, the method further comprises removing a central portion of the first backing tape. The central portion of the first backing tape may be removed prior to bonding the first backing tape to the passive surface of the device wafer.

According to an embodiment of the method, the method further comprises cutting a first trench on the first backing tape. The first trench encircles the device wafer. In another aspect of the described method, the method further comprises cutting a second trench on the first backing tape. The first trench encircles the second trench. The first or second trench is formed prior to removing the outer portions of the device wafer and of the rigid body from the first backing tape.

According to an embodiment of the described method, the method further comprises removing a strip of the first backing tape from the second backing tape. In one aspect of the described method, the first and second trenches border the strip of tape. The outer portion of the rigid body may be attached to the strip of tape. In another aspect of the described method, the strip, the first trench and the hollow center border the strip of tape. The outer portion of the rigid body may be attached to the strip of tape. The strip of tape may be removed with the step of removing the outer portions of the device wafer and of the rigid body from the first backing tape.

According to an embodiment of the described method, the method further comprises releasing the strip of the first backing tape from the second backing tape. The strip of the first backing tape is released by weakening the bonding at the outer portion of the second backing tape by irradiating the area with ultraviolet light. The adhesive of the second backing tape is the type that weakens when irradiated with ultraviolet light.

In another aspect of the described method, the strip is released by weakening the bonding of the outer portion of the second backing tape by heat. The second backing tape is of a type that weakens when heated.

In a different aspect of the described method, the first strip is released by omitting the adhesive at the second backing tape. This eases the removal of the outer portions of the rigid body and of the device wafer from the first backing tape.

In the following paragraphs, embodiments of the method are described in connection with the figures.

FIGS. 1(A) to 1(F) show, in cross-sectional view, the respective steps 1(A) to 1(F) of a known method for producing a thin semiconductor wafer.

Figure 1A:
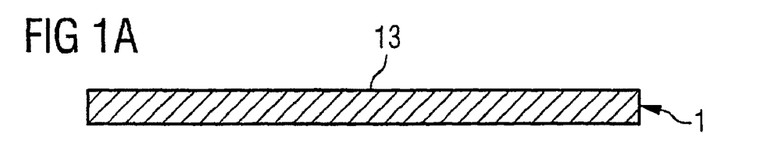
FIGS. 1(A) to 1(F) show prior art for producing a thin semiconductor wafer.

In step 1(A), a device wafer 1 is provided. The device wafer 1 includes an active surface 13 that is facing upwards. The device wafer 1 contains a number of semiconductor chips, which are not shown.

Figure 1B:
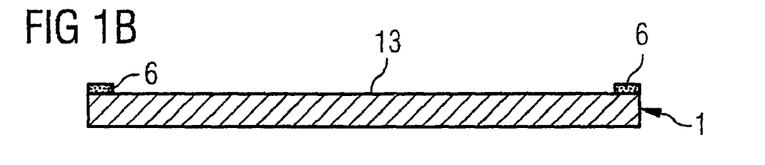

Next, in step 1(B), a layer of adhesive 6 is provided on the outer top surface of the device wafer 1. The adhesive 6 contains a non-conductive material. This feature prevents the adhesive 6 from forming short circuits between the electrical circuits that are found on the top surface of the device wafer 1.

Figure 1C:
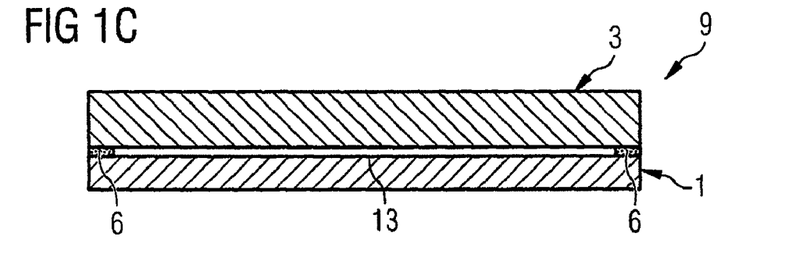

Next, in step 1(C), a carrier wafer 3 is placed above the device wafer 1. The carrier wafer 3 provides a support for the device wafer 1 and is bonded to the device wafer 1 by the layer of adhesive 6. The carrier wafer 3 and the device wafer 1 form a wafer module 9.

Figure 1D:
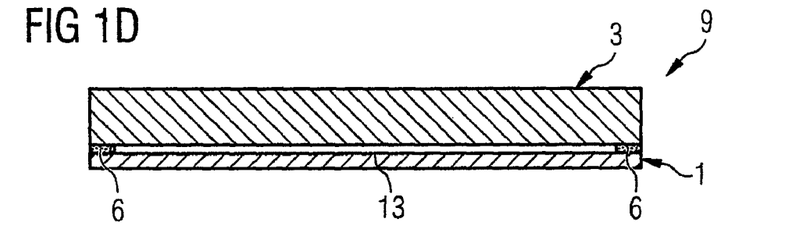

Next, in step 1(D), the device wafer 1 of the wafer module 9 is thinned. In wafer thinning, the passive surface of the device wafer 1 that is opposite the active surface is ground to reduce the thickness of the device wafer 1. The carrier wafer 3 provides a support for the device wafer 1 to prevent wafer cracks.

Figure 1E:
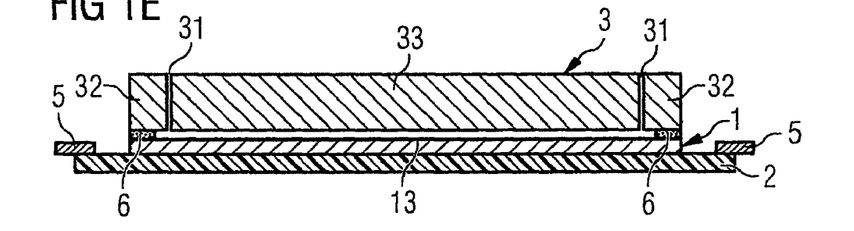

Next, in step 1(E), a ring-shaped mounting frame 5 is provided above a backing tape 2. A layer of adhesive, which is not shown, is provided over the top surface of the backing tape 2. This adhesive bonds the mounting frame 5 to the backing tape 2.

Then, the wafer module 9 is placed above a backing tape 2. The backing tape 2 has a layer of adhesive on its top surface and bonds the mounting frame 5 and the device wafer 1 onto the backing tape 2. The mounting frame 5 encircles the wafer module 9.

After this, a wafer saw cuts the carrier wafer 3 and separates the central portion 33 of the carrier wafer 3 from its outer portion 32. The central portion 33 of the carrier wafer 3 is separated from the outer portion 32 of this wafer 3 by a gap 31. The outer portion 32 of the carrier wafer 3 is known as a silicon ring.

Figure 1F:
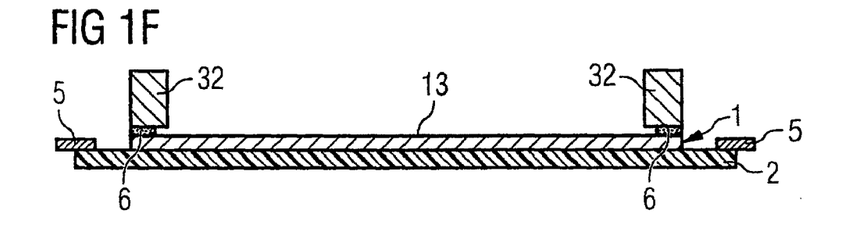

Next, in this step 1(F), the central portion 33 of the carrier wafer 3 is removed. The removal of the central portion 33 of the carrier wafer 3 exposes the top surface of the device wafer 3 for a later step of wafer dicing.

During wafer dicing, the semiconductor chips that form the device wafer 3 are separated from one another. The saw selected for wafer dicing is thick enough to saw the device wafer 1 and the silicon ring that is attached to the device wafer 1. Due to inconsistent bonding of the adhesive layer 6, parts of the silicon ring may break off during wafer dicing and thereby cause damage to the device wafer 1.

FIGS. 2(A) to 2(E) show, in cross-sectional view, the respective steps 2(A) to 2(E) in a first embodiment of the described method of producing a thin semiconductor wafer.

Figure 2A:
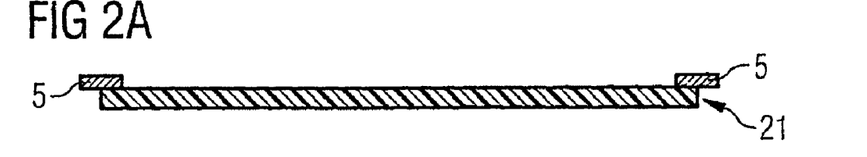
FIGS. 2(A) to 2(E) show a first embodiment of a method for producing a thin semiconductor wafer.

In step 2(A), a mounting frame 5 is provided above a backing tape. The top surface of the backing tape 21 is coated with a layer of adhesive that weakens when it is irradiated with an UV (ultraviolet) light. The layer of adhesive is not shown in the figure.

Figure 2B:
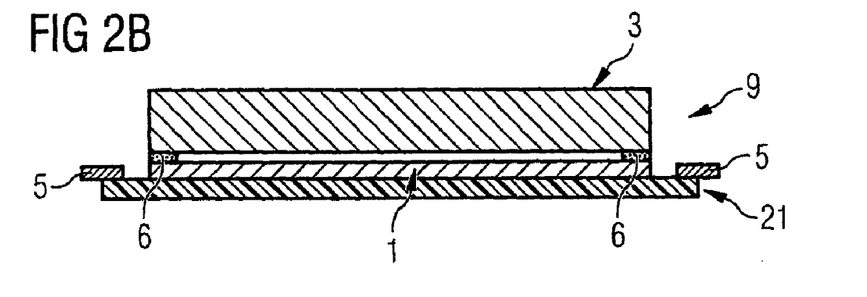

Next, in step 2(B), a wafer module 9 comprising a device wafer 1 and a rigid body 3 (e.g., carrier wafer) bonded via a non-conductive adhesive layer 6 is arranged above the backing tape 21.

Figure 2C:
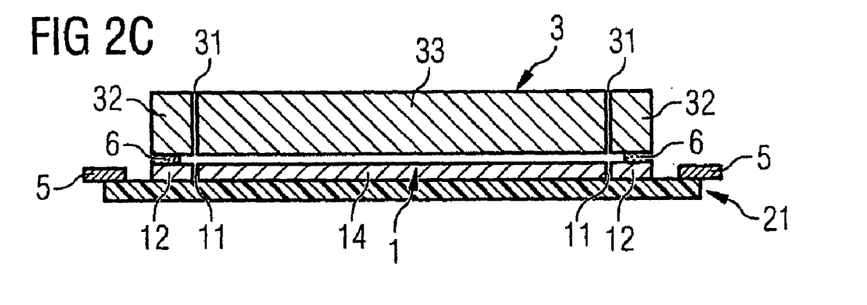

Next, in step 2 (C), a wafer saw cuts the carrier wafer 3. The wafer sawing is sufficiently deep such that the device wafer 1 is also cut. The wafer sawing separates the central portion 33 of the carrier wafer 3 from its outer portion 32 by a gap 31. The wafer sawing also separates the central portion 14 of the device wafer 1 from its outer portion 12 by a gap 11.

Figure 2D:
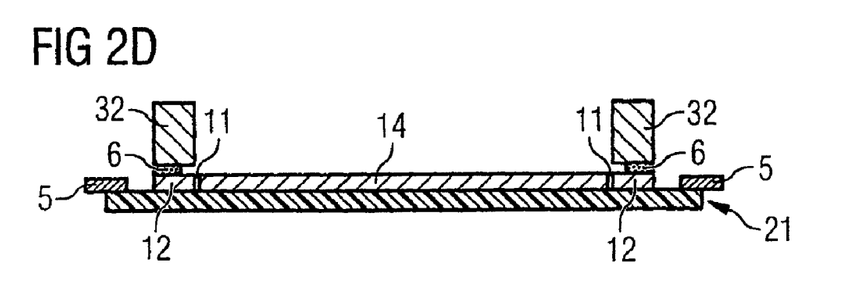

Next, in step 2(D), the central portion 33 of the carrier wafer 3 is removed.

Figure 2E:
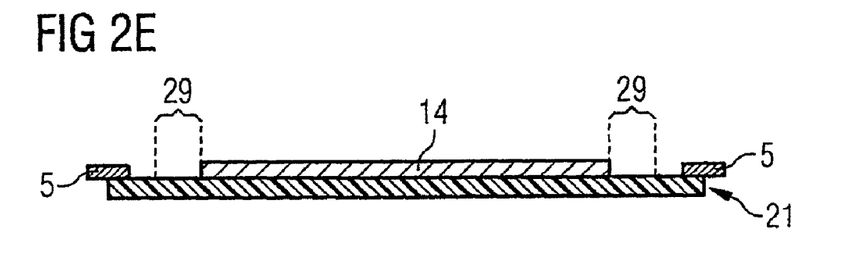

Next, in step 2(E), the outer portion 29 of the backing tape 21 that is below the outer portion 12 of the device wafer 1 is irradiated with UV light. This weakens the bonding between the backing tape 21 and the outer portion 12 of the device wafer 1. After this, the outer portion 12 of the device wafer 1 along with the outer portion 32 of the carrier wafer 3 is separated from the backing tape 21.

In a later step, the central portion 14 of the device wafer 1 is diced. Semiconductor chips are placed in the central portion 14. The saw blade selected to dice the wafer needs to be thick enough to saw the device wafer 1. Contrary to known methods, the implement (e.g., saw blade) selected to perform the wafer dicing is selected such that the saw blade is sufficiently thick enough to cut both the device wafer 1 and the silicon ring.

FIGS. 3(A) to 3(D) show, in cross-sectional view, the respective steps 3(A) to 3(D) in a second embodiment of the method of producing a thin semiconductor chip.

Figure 3A:
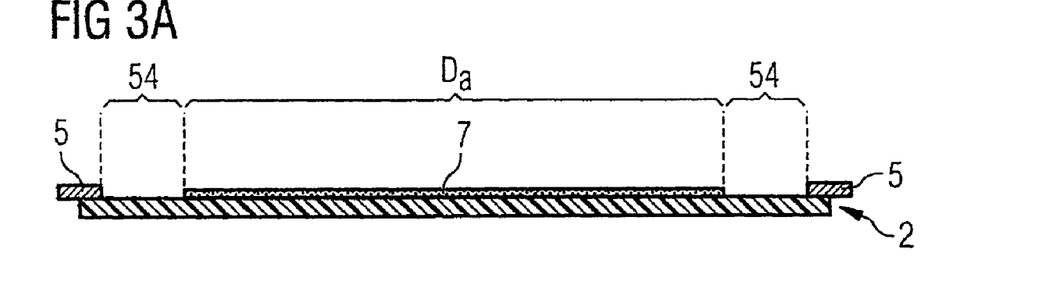
FIGS. 3(A) to 3(D) show a second embodiment of the method for producing a thin semiconductor wafer.

In step 3(A), an annular mounting frame 5 is provided over a backing tape 2.

After this, a layer of adhesive 7 is provided over the central portion of the backing tape 2. The outer portion 54 of the backing tape 2 does not contain an adhesive.

Figure 3B:
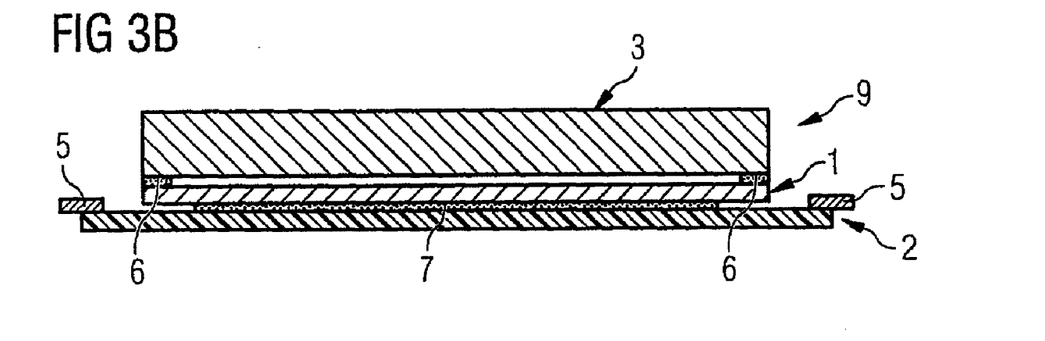

Next, in step 3(B), a wafer module 9 comprising a device wafer 1 and a rigid body 3 (e.g., carrier wafer) bonded via a non-conductive adhesive layer 6 is arranged over the backing tape 2. The adhesive 7 bonds the wafer module 9 on to the backing tape 2.

Figure 3C:
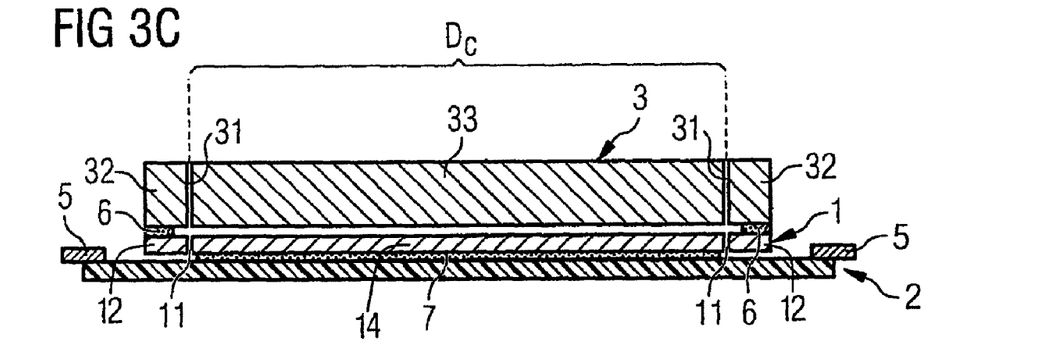

Next, in step 3(C), a wafer saw cuts the carrier wafer 3 and device wafer 1. The wafer sawing separates the central portion 33 of the carrier wafer 3 from its outer portion 32 by a gap 31. The wafer sawing is sufficiently deep such that the device wafer 1 is also cut. The wafer sawing separates the central portion 14 of the device wafer 1 from its outer portion 12 by a gap 11.

Figure 3D:
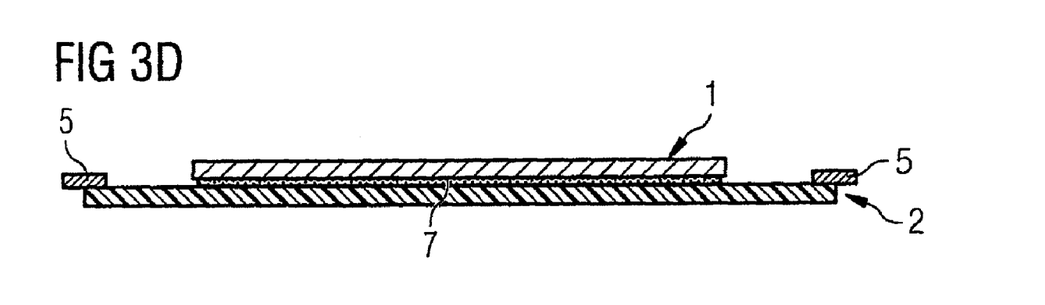

Next in step 3(D), the central portion 33 of the carrier wafer 3 with the outer portions of the carrier and device wafer 12 and 32 are removed. The diameter $D_a$ of the adhesive layer 7 is smaller than the diameter $D_c$ of the central portion 33 of the carrier wafer 3. This allows the outer portions 12 and 32 to be easily removed.

Compared with the first embodiment, this embodiment does not require a tape that contains an adhesive that weakens when irradiated with UV light.

FIGS. 4(A) to 4(E) show, in cross-sectional view, respective steps 4(A) to 4(E) according to a third embodiment of the method of producing a thin semiconductor wafer.

Figure 4A:
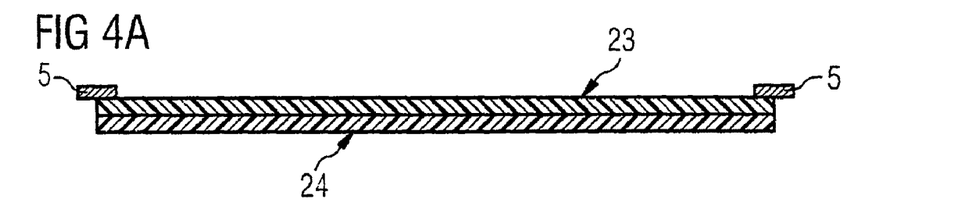
FIGS. 4(A) to 4(E) show a third embodiment of the method for producing a thin semiconductor wafer.

In step 4(A), a sheet of first backing tape 23 is placed above a sheet of second backing tape 24. A mounting frame 5 is arranged above the first backing tape 23. A layer of adhesive is provided on the top surfaces of both the first backing tape 23 and the second backing tape 24. These layers of adhesive are not shown in the figure. The layer of adhesive that is on the second backing tape 24 is characterized in that the bonding weakens when irradiated with UV light.

Figure 4B:
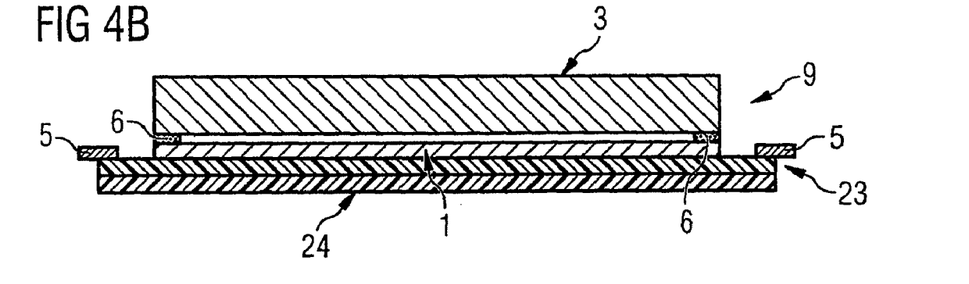

Next, in step 4(B), a wafer module 9 comprising a device wafer 1 and a rigid body 3 (e.g., carrier wafer) bonded via a non-conductive adhesive layer 6 is arranged over the first backing tape 23.

Figure 4C:
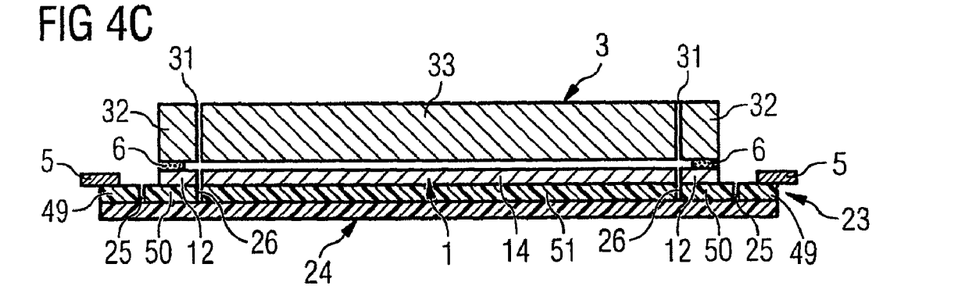

Next, in step 4(C), a wafer saw cuts the surface of the carrier wafer 3, device wafer 1 and the first backing tape 23. The wafer sawing of carrier wafer 3 separates the outer portion 32 of the carrier wafer 3 from its central portion 33. A gap 31 separates the outer portion 32 from the central portion 33. The wafer sawing also cuts the device wafer 1 as well as the first backing tape 23 and forms a second trench 26 on the top surface of the device wafer 1. The second trench 26 separates the outer portion 12 of the device wafer 1 from its central portion 14 and the outer portion of the first backing tape 23 from its central portion 51.

After this, the first backing tape 23 is cut. The cut forms a first trench 25 on the surface of the first backing tape 23. The first trench 25 is arranged in the space between the mounting frame 5 and the carrier wafer 3. The first trench 25 separates the outer portion of the first backing tape 23 into an outer ring tape 49 and an inner ring tape 50 (i.e., the strip (50) of the first backing tape (23) that is between the first and second trenches (25) and (26)). In other words, the inner ring 50 is disposed between the first and the second trenches 25 and 26 and the outer ring 49 encircles the inner ring 50.

Figure 4D:
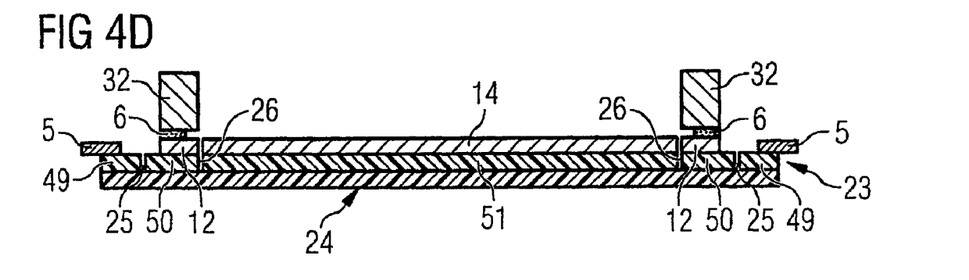

Next, in step 4(D), the central portion 33 of the carrier wafer 3 is removed.

Figure 4E:
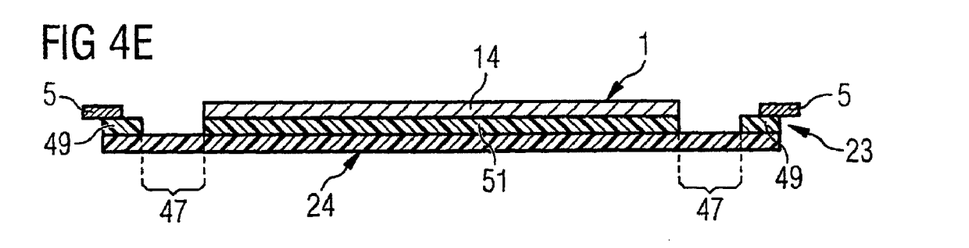

Next, in step 4(E), the outer portion 47 of the second backing tape 21 that is below the inner ring tape 50 is irradiated with UV light. This irradiation weakens the bonding of the inner ring tape 50 with the second backing tape 24.

Following this, the inner ring tape 50, the outer portion 32 of the carrier wafer 3 and the outer portion 12 of the device wafer 1 are removed from the first backing tape 23.

Compared with the first embodiment, this embodiment requires an added sheet of backing tape and more process steps.

FIGS. 5(A) to 5(F) show, in cross-sectional view, the respective steps 5(A) to 5(F) according to a fourth embodiment of the method of producing a thin semiconductor chip.

Figure 5A:
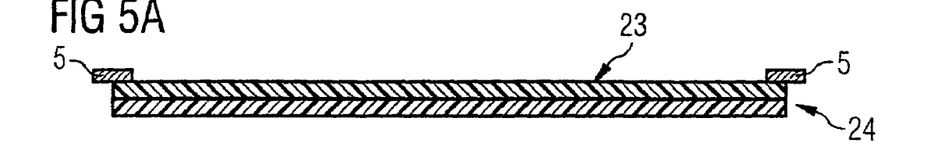
FIGS. 5(A) to 5(F) show a fourth embodiment of the method for producing a thin semiconductor wafer.

In step 5(A), a first backing tape 23 is placed over a second backing tape 24. A mounting frame 5 is provided over the first backing tape 23. Both the first and second backing tapes 23 and 24 comprise a layer of adhesive on their top surface. The layer of adhesive is not shown in the figure. The layer of adhesive that is over the second backing tape 24 weakens in bonding strength when irradiated with UV light.

Figure 5B:
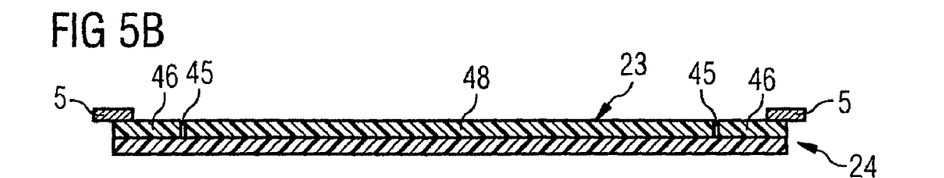

Next, in step 5(B), the first backing tape 23 is cut 45 to separate the central portion 48 of the first backing tape 23 from its outer portion 46.

Figure 5C:
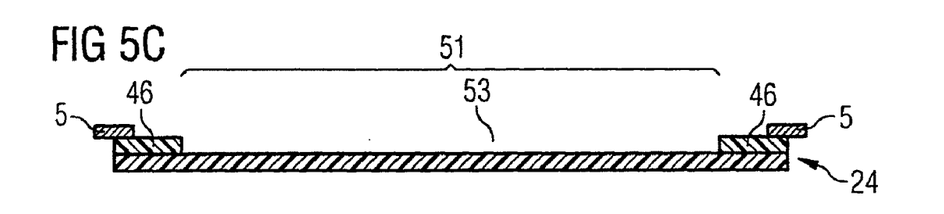

Next in step 5(C), the rear surface 51 of the second backing tape 24 that is below the central portion 48 of the first backing tape 23 is irradiated with UV light. The UV light weakens the bonding strength between the central portion of the first backing tape 23 and the second backing tape 24.

Following this, the central portion 48 of the first backing tape 23 is removed. This creates a hollow center 53 on the first backing tape 23.

Figure 5D:
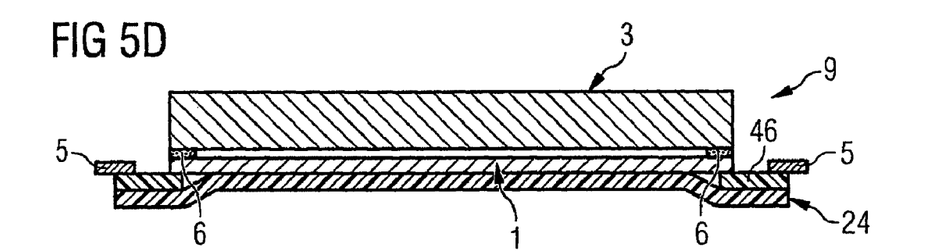

Next in step 5(D), a wafer module 9 comprising a device wafer 1 and a rigid body 3 (e.g., carrier wafer) bonded via a non-conductive adhesive layer 6 is arranged over the first backing tapes 23. The second backing tape 24 is slightly stretched to stick to the rear surface of the device wafer 1.

Figure 5E:
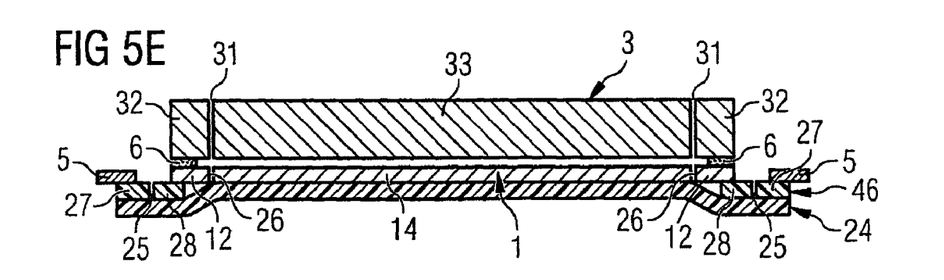

Next in step 5(E), a wafer saw cuts the carrier wafer 3 and the device wafer 1. The wafer sawing separates the outer portion 32 of the carrier wafer 3 from its central portion 33 by a gap 31. The wafer sawing also forms a second trench 26 in the device wafer 1. The second trench 26 separates the outer portion 12 of the device wafer 1 from its central portion 14.

Subsequently, the outer portion 46 of the first backing tape 23 is cut. The outer portion 46 is cut in the space between the mounting frame 5 and the carrier wafer 3. The cut forms a first trench 25 on the surface of the outer portion 46. The first trench 25 separates the outer portion 46 into an outer ring tape 27 and an inner ring tape 28.

Figure 5F:
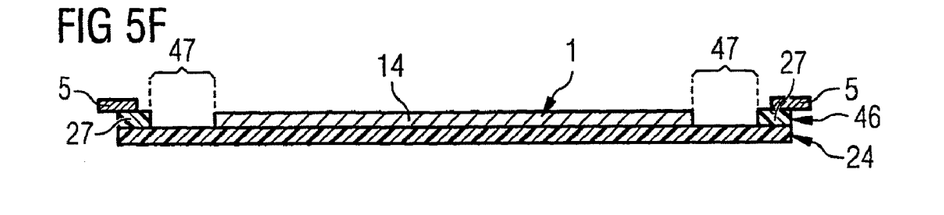

Next, in step 5(F), the central portion 33 of the carrier wafer 3 is removed.

Thereafter, the outer portion 47 of the second backing tape 24 that is below the outer portion 12 of the device wafer 1 and the inner ring tape 28 is irradiated with UV light. The UV light weakens the bonding of the inner ring tape 28 (i.e., the strip (28) of the first backing tape (23) that is between the first and second trenches (25) and (26)) and the outer portion 12 with the second backing tape 24.

Following this, the inner ring tape 28, the outer portions of the device wafer and the carrier wafer 12, 32 are removed.

Compared with the first embodiment, this embodiment needs another sheet of backing tape and needs more process steps. However, the outer portion 12 of the device wafer 1 is not fully attached to the second backing tape 24 and therefore can be easily removed.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of fabricating a semiconductor chip, the method comprising:
    providing an adhesive layer on the outer area of an active surface of a device wafer;
    bonding a rigid body to the active surface of the device wafer by the adhesive layer;
    thinning the device wafer by treating a passive surface of the device wafer that is opposite to the active surface;
    bonding a second backing tape below a first backing tape;
    bonding the first backing tape to the passive surface of the device wafer after bonding the second backing tape below the first backing tape;
    sawing sufficiently deeply to separate an outer portion of the rigid body from a central portion of the rigid body and to separate an outer portion of the device wafer from a central portion of the device wafer;
    removing the central portion of the rigid body from over the central portion of the device wafer;
    cutting a first trench in the first backing tape, the first trench encircling the device wafer;
    cutting a second trench in the first backing tape, the first trench encircling the second trench;
    removing the strip of the first backing tape that is disposed between the first and second trenches, the outer portion of the device wafer, and the outer portion of the rigid body from the second backing tape after cutting the first and second trenches; and
    dicing the device wafer into semiconductor chips.

2. The method of claim 1, further comprising:
    weakening the bonding at an outer portion of the second backing tape disposed below the outer portion of the device wafer by irradiating the outer portion of the second backing tape with ultraviolet light, before removing the strip of the first backing tape that is disposed between the first and second trenches, the outer portion of the device wafer, and the outer portion of the rigid body from the second backing tape, the second backing tape comprising an adhesive that weakens when irradiated with ultraviolet light.

3. The method of claim 1, further comprising:
    weakening the bonding at an outer portion of the second backing tape disposed below the outer portion of the device wafer by heating the outer portion of the second backing tape, before removing the strip of the first backing tape that is disposed between the first and second trenches, the outer portion of the device wafer, and the outer portion of the rigid body from the second backing tape, the second backing tape comprising an adhesive that weakens when heated.

4. The method of claim 1, further comprising:
    omitting an adhesive at the outer portion of the second backing tape disposed below the outer portion of the device wafer, before bonding the second backing tape below the first backing tape and bonding the first backing tape to the passive surface of the device wafer.

5. A method of fabricating a semiconductor chip, the method comprising:
    providing an adhesive layer on the outer area of an active surface of a device wafer;
    bonding a rigid body to the active surface of the device wafer by the adhesive layer;
    thinning the device wafer by treating a passive surface of the device wafer that is opposite to the active surface;
    bonding a first backing tape to the passive surface of the device wafer;
    bonding a second backing tape below the first backing tape and removing a central portion of the first backing tape creating a hollow center on the first backing tape, before bonding the first backing tape to the passive surface of the device wafer;
    separating an outer portion of the rigid body from a central portion of the rigid body and separating an outer portion of the device wafer from a central portion of the device wafer;
    removing the central portion of the rigid body from over the central portion of the device wafer;
    removing the outer portion of the device wafer and the outer portion of the rigid body from the first backing tape; and
    dicing the device wafer into semiconductor chips.

6. The method of claim 5, further comprising:
    cutting a first trench in the first backing tape before removing the outer portion of the device wafer and the outer portion of the rigid body from the first backing tape, the first trench encircling the device wafer.

7. The method of claim 6, further comprising:
    cutting a second trench in the first backing tape prior to removing the outer portion of the device wafer and the outer portion of the rigid body, the first trench encircling the second trench.

8. The method of claim 7, further comprising:
    removing the strip of the first backing tape that is disposed between the first and second trenches with removal of the outer portion of the device wafer and the outer portion of the rigid body.

9. The method of claim 8, further comprising:
    weakening the bonding at an outer portion of the second backing tape disposed below the strip of the first backing tape by irradiating the outer portion of the second backing tape with ultraviolet light, before removing the outer portion of the device wafer and the outer portion of the rigid body from the first backing tape, the second backing tape comprising an adhesive that weakens when irradiated with ultraviolet light.

10. The method of claim 8, further comprising:
weakening the bonding at an outer portion of the second backing tape disposed below the strip of the first backing tape by heating the outer portion of the second backing tape, before removing the outer portion of the device wafer and the outer portion of the rigid body from the first backing tape, the second backing tape comprising an adhesive that weakens when heated.

11. The method of claim 8, further comprising:
omitting an adhesive at an outer portion of the second backing tape disposed below the strip of the first backing tape before bonding the first backing tape to the passive surface of the device wafer.

12. The method of claim 6, further comprising:
removing the strip of the first backing tape that is disposed between the first trench and the hollow center with removal of the outer portion of the device wafer and the outer portion of the rigid body.

13. The method of claim 12, further comprising:
weakening the bonding at an outer portion of the second backing tape disposed below the strip of the first backing tape by irradiating the outer portion of the second backing tape with ultraviolet light, before removing the outer portion of the device wafer and the outer portion of the rigid body from the first backing tape, the second backing tape comprising an adhesive that weakens when irradiated with ultraviolet light.

14. The method of claim 12, further comprising:
weakening the bonding at an outer portion of the second backing tape disposed below the strip of the first backing tape by heating the outer portion of the second backing tape, before removing the outer portion of the device wafer and the outer portion of the rigid body from the first backing tape, the second backing tape comprising an adhesive that weakens when heated.

15. The method of claim 12, further comprising:
omitting an adhesive at an outer portion of the second backing tape disposed below the strip of the first backing tape, before bonding the first backing tape to the passive surface of the device wafer.

16. The method of claim 1, further comprising:
weakening the bonding at an outer portion of the second backing tape disposed below the strip of the first backing tape by irradiating the outer portion of the second backing tape with ultraviolet light, before removing the outer portion of the device wafer and the outer portion of the rigid body from the first backing tape, the second backing tape comprising an adhesive that weakens when irradiated with ultraviolet light.

17. The method of claim 1, further comprising:
weakening the bonding at an outer portion of the second backing tape disposed below the strip of the first backing tape by heating the outer portion of the second backing tape, before removing the outer portion of the device wafer and the outer portion of the rigid body from the first backing tape, the second backing tape comprising an adhesive that weakens when heated.

18. The method of claim 1, further comprising:
omitting an adhesive at an outer portion of the second backing tape disposed below the strip of the first backing tape, before bonding the first backing tape to the passive surface of the device wafer.

19. The method of claim 7 further comprising:
removing the strip of the first backing tape that is disposed between the first trench and the hollow center with removal of the outer portion of the device wafer and the outer portion of the rigid body.

20. The method of claim 19, further comprising:
weakening the bonding at an outer portion of the second backing tape disposed below the strip of the first backing tape by irradiating the outer portion of the second backing tape with ultraviolet light, before removing the outer portion of the device wafer and the outer portion of the rigid body from the first backing tape, the second backing tape comprising an adhesive that weakens when irradiated with ultraviolet light.

21. The method of claim 19, further comprising:
weakening the bonding at an outer portion of the second backing tape disposed below the strip of the first backing tape by heating the outer portion of the second backing tape, before removing the outer portion of the device wafer and the outer portion of the rigid body from the first backing tape, the second backing tape comprising an adhesive that weakens when heated.

22. The method of claim 19, further comprising:
omitting an adhesive at an outer portion of the second backing tape disposed below the strip of the first backing tape, before bonding the first backing tape to the passive surface of the device wafer.

* * * * *